(12) United States Patent
Mei et al.

(10) Patent No.: US 10,209,822 B2
(45) Date of Patent: Feb. 19, 2019

(54) TOUCH SENSOR AND METHOD FOR DETERMINING TOUCH POSITION BY GROUPING ELECTRODES

(71) Applicant: NXP USA, INC., Austin, TX (US)

(72) Inventors: Wangsheng Mei, Suzhou (CN); Yonggang Chen, Suzhou (CN); Ben Wang, Suzhou (CN); Kun Wu, Suzhou (CN)

(73) Assignee: NXP USA, INC., Austin, TX (US)

( * ) Notice: Subject to any disclaimer, the term of this patent is extended or adjusted under 35 U.S.C. 154(b) by 46 days.

(21) Appl. No.: 15/464,069

(22) Filed: Mar. 20, 2017

(65) Prior Publication Data

US 2018/0267662 A1    Sep. 20, 2018

(30) Foreign Application Priority Data

Mar. 14, 2017   (CN) .......................... 2017 1 0149490

(51) Int. Cl.
*G06F 3/041* (2006.01)
*G06F 3/044* (2006.01)
*H03M 11/00* (2006.01)

(52) U.S. Cl.
CPC ............ *G06F 3/0416* (2013.01); *G06F 3/044* (2013.01); *H03M 11/00* (2013.01); *G06F 2203/04104* (2013.01)

(58) Field of Classification Search
CPC ................... G06F 3/0416; G06F 2203/04104
See application file for complete search history.

(56) References Cited

U.S. PATENT DOCUMENTS

| | | | |
|---|---|---|---|
| 7,006,077 B1 | 2/2006 | Uusimaki | |
| 7,973,771 B2 | 7/2011 | Geaghan | |
| 8,040,321 B2 | 10/2011 | Peng et al. | |
| 8,169,421 B2 | 5/2012 | Wright | |
| 8,493,351 B2 * | 7/2013 | Peng | G06F 3/044 |
| | | | 178/18.06 |
| 2007/0273560 A1 | 11/2007 | Hua et al. | |
| 2010/0224424 A1 * | 9/2010 | Kasajima | G06F 3/0412 |
| | | | 178/18.06 |
| 2017/0228074 A1 * | 8/2017 | Du | G02F 1/133514 |

* cited by examiner

*Primary Examiner* — Kwang-Su Yang
(74) *Attorney, Agent, or Firm* — Charles E. Bergere

(57) ABSTRACT

A touch sensor includes electrodes that are serially arranged and a processor with multiple input terminals. The electrodes are grouped into first, second and third groups of electrodes. Each electrode of the first group is coupled with a corresponding input terminal of the processor. The electrodes of the second group are sequentially coupled with the input terminals of the processor by way of odd numbered electrodes of the first group. The electrodes of the third group are sequentially coupled with the input terminals of the processor by way of even numbered electrodes of the first group. Each of the electrodes, other than the electrodes on the ends, is triggered simultaneously with at least one of its neighboring electrodes to provide sensed signals to the processor.

19 Claims, 6 Drawing Sheets

| Input Terminal 1 | Input Terminal 2 | Input Terminal 3 | Input Terminal 4 | Input Terminal 5 | Input Terminal 6 | Position | Electrode1 | Electrode2 |
|---|---|---|---|---|---|---|---|---|
| 1 | 0 | 0 | 0 | 0 | 0 | 0 | 302 | |
| 1 | 1 | 0 | 0 | 0 | 0 | 1 | 302 | 304 |
| 0 | 1 | 1 | 0 | 0 | 0 | 2 | 304 | 306 |
| 0 | 0 | 1 | 1 | 0 | 0 | 3 | 306 | 308 |
| 0 | 0 | 0 | 1 | 1 | 0 | 4 | 308 | 310 |
| 1 | 0 | 1 | 0 | 0 | 1 | 5 | 310 | 312 |
| 1 | 0 | 1 | 0 | 1 | 1 | 6 | 312 | 314 |
| 0 | 0 | 0 | 0 | 0 | 0 | 7 | 314 | 316 |
| 0 | 1 | 0 | 0 | 1 | 0 | 8 | 316 | 318 |
| 0 | 1 | 0 | 1 | 1 | 0 | 9 | 318 | 320 |
| 0 | 0 | 0 | 1 | 0 | 1 | 10 | 320 | 322 |
| 0 | 0 | 0 | 0 | 0 | 1 | 11 | 322 | 324 |
| 0 | 0 | 0 | 0 | 0 | 1 | 12 | 324 | |

| Chn0 Value | Chn1 Value (optional) | Position |
|---|---|---|
| 12152 | 0 | 0 |
| 11715 | 3 | 1 |
| 11286 | 7 | 2 |
| 10865 | 15 | 3 |
| 10452 | 36 | 4 |
| 10047 | 65 | 5 |
| 9650 | 102 | 6 |
| ... | ... | ... |
| 330 | 8142 | 55 |
| 0 | 12152 | 56 |

Table 1 Lookup table for Signal – Position Correspondence

FIG. 6A
- PRIOR ART -

| Chn0 Flag | Chn1 Flag | Chn2 Flag | Chn3 Flag | Chn4 Flag | Chn5 Flag | Position |
|---|---|---|---|---|---|---|
| TRUE | FALSE | FALSE | FALSE | FALSE | FALSE | 1 |
| TRUE | TRUE | FALSE | FALSE | FALSE | FALSE | 2 |
| FALSE | TRUE | TRUE | FALSE | FALSE | FALSE | 3 |
| FALSE | FALSE | TRUE | TRUE | FALSE | FALSE | 4 |
| FALSE | FALSE | FALSE | TRUE | TRUE | FALSE | 5 |
| FALSE | FALSE | FALSE | FALSE | TRUE | TRUE | 6 |
| FALSE | FALSE | FALSE | FALSE | FALSE | TRUE | 7 |

Table 2 Lookup table for Signal – Position Correspondence

FIG. 6B
- PRIOR ART -

TOUCH SENSOR AND METHOD FOR
DETERMINING TOUCH POSITION BY
GROUPING ELECTRODES

BACKGROUND

The present invention generally relates to touch sensors and, more particularly, to a method for determining a touch position on the touch sensor using a touch slider.

Touch sensors are useful in Human-Machine Interface (HMI) applications. Touch sensors can be used in toys, white goods, etc. for adjusting specific user parameters, such as brightness and volume or for scrolling displayed menus.

A touch sensor includes electrodes that when touched, detect a change in resistance or capacitance thereof and generate a trigger signal. The trigger signal is input to a controller or processor to determine the position of the touch on the touch sensor.

FIG. 1 is a schematic diagram of a touch sensor 10. The sensor includes an electrode 102 and an optional electrode 104. The electrodes 102 and 104 are triangular in shape, mutually complementary, and arranged to form a rectangle. The electrodes 102 and 104 are coupled to a controller 12. The controller 12 includes input terminals Chn0 and Chn1 corresponding to and respectively coupled with the electrodes 102 and 104. Touch positions like P0 and P1 are shown at the bottom of the figure to avoid overlapping the labels of the electrodes, although in practice touch positions could be exactly on the electrodes. When the electrodes 102 and 104 are touched, such as by a user's fingers, there is a change in the resistances or capacitances of the electrodes. Table 1 shown in FIG. 6A is an exemplary correspondence table that maps the values of the received signals on the input terminals Chn0 and Chn1 with the touch positions.

In response to the received signals, the touch position can be determined by looking up the value of the received signals in the table. However, the values of the received signals suffer greatly from noise. The signals provided by the electrodes tend to be coupled, especially in white goods applications, with noise from power supplies, which makes it difficult to accurately determine the position of the touch.

FIG. 2 is a schematic diagram of another touch sensor 20. The touch sensor 20 includes a plurality of electrodes E0-E5, and a controller 22 coupled with the electrodes E0-E5 for receiving trigger signals therefrom. The controller 22 includes input terminals Chn0-Chn5 corresponding to and coupled with respective ones of the electrodes E0-E5. As shown in FIG. 2, when the electrode E0 is touched, for example in the position P0, a parameter of the electrode E0, for example capacitance when the electrode is a capacitive sensing element or resistance when the electrode is a resistive sensing element, will change. The signal that the electrode E0 provides to the corresponding input terminal Chn0 of the controller 22 changes accordingly. The controller 22 determines the touch position P0 using the signal received from the electrode E0. If more than one of the electrodes, for example electrodes E2 and E3 are simultaneously touched at the position P1, both electrodes E2 and E3 responsively show parameter changes and in turn provide the controller 22 with changed signals at input terminals Chn2 and Chn3. The position P1 is determined by the controller 22 through the received signal composition.

Table 2 shown in FIG. 6B shows an exemplary correspondence table that maps the values of the received signals on the input terminals Chn0-Chn5 with the touch positions:

In Table 2, the values of the received signals on the input terminals Chn0-Chn5 are digitized to accommodate for noise, and each electrode E0-E5 is configured to a corresponding input terminal Chn0-Chn5 of the controller 22 with a given granularity related to human finger sizes. For example, a larger sensor with more electrodes will require the controller to have more input terminals, which may adversely affect the size of the controller.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a touch sensor including a processor having multiple input terminals, and a plurality of electrodes arranged in series. The electrodes comprise a first group of serially arranged electrodes, each of the first group of electrodes being coupled with a corresponding input terminal of the processor; a second group of electrodes serially arranged at an end of the first group of electrodes, the second group of electrodes being sequentially coupled with the input terminals of the processor that are coupled to odd numbered electrodes of the first group; and a third group of electrodes serially arranged at an end of the second group of electrodes opposite to the first group of electrodes, the third group of electrodes being sequentially coupled with the input terminals of the processor that are coupled to even numbered electrodes of the first group. The plurality of electrodes is arranged such that each of the electrodes other than the electrodes on the ends is triggered simultaneously with at least one of its neighboring electrodes. When an electrode is triggered the triggered electrode generates a corresponding sensed signal.

In another embodiment, the present invention provides a method for determining a touch position on a touch sensor, where the touch sensor comprises multiple serially arranged electrodes that are arranged in first, second and third sequentially arranged groups. The method includes coupling the first group of electrodes for receiving sensed signals from the electrodes, sequentially coupling the electrodes of the second group to odd numbered electrodes of the first group, and sequentially coupling the electrodes of the third group to even numbered electrodes of the first group. The multiple electrodes are arranged such that a touch contacts at least two adjacent ones of the electrodes triggering each of the electrodes to generate a sensed signal. The method further includes determining a touch position on the electrodes using the generated sensed signals.

In yet another embodiment, the present invention provides a touch sensor including a first number of serially arranged electrodes configured to provide sensed signals when touched, and a processor having a second number of input terminals for receiving the sensed signals, where the second number is less than the first number. Each of the input terminals is coupled with two of the electrodes for receiving the corresponding sensed signals therefrom, and the processor is operable to determine a touch position on the electrodes in response to simultaneously receiving two sensed signals from two neighboring electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

FIG. 4 is an exemplary lookup table for the touch sensor of FIG. 3;

FIGS. 6A and 6B are signal to position correspondence look-up tables.

DETAILED DESCRIPTION

Figure 1:
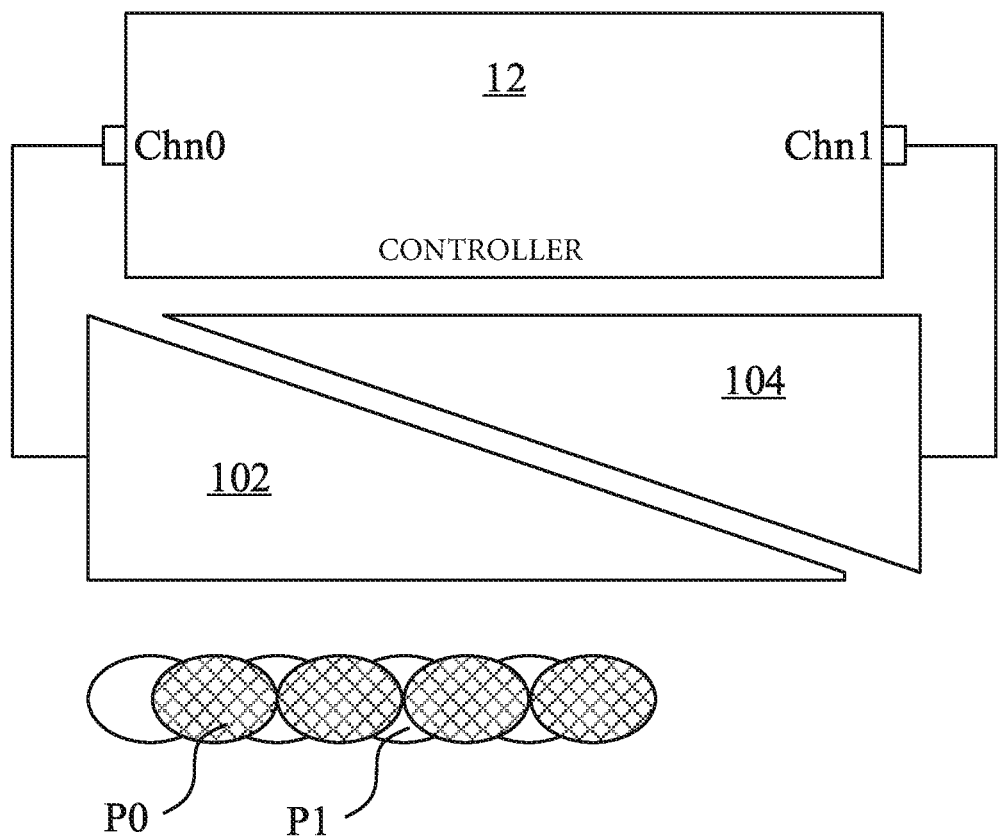
FIG. 1 is a schematic diagram of a first conventional touch sensor.
Figure 2:
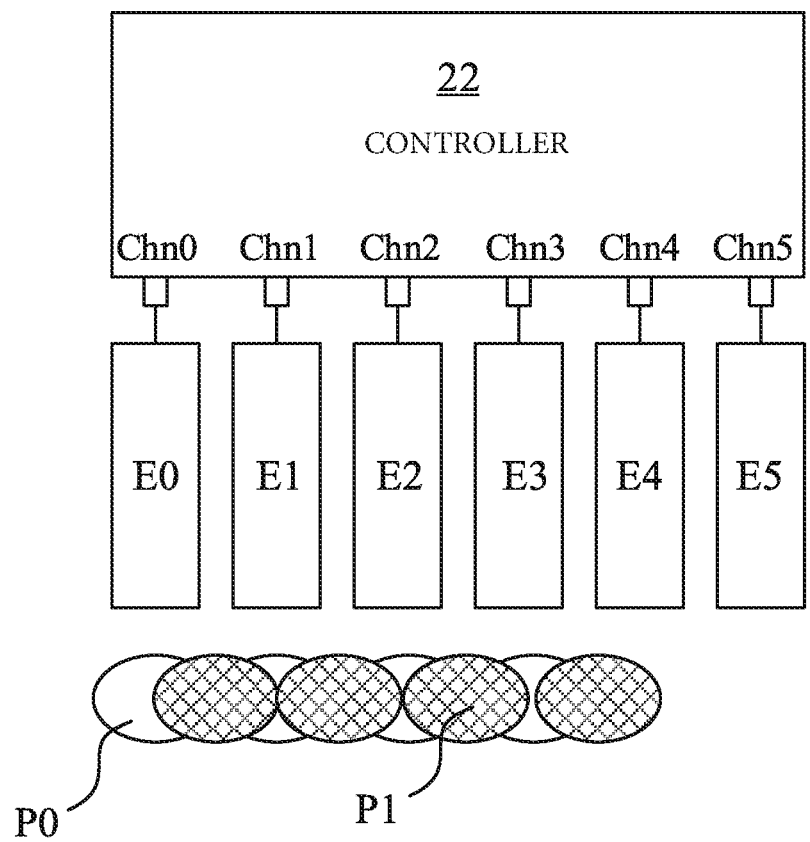
FIG. 2 is a schematic diagram of another conventional touch sensor.
Figure 3:
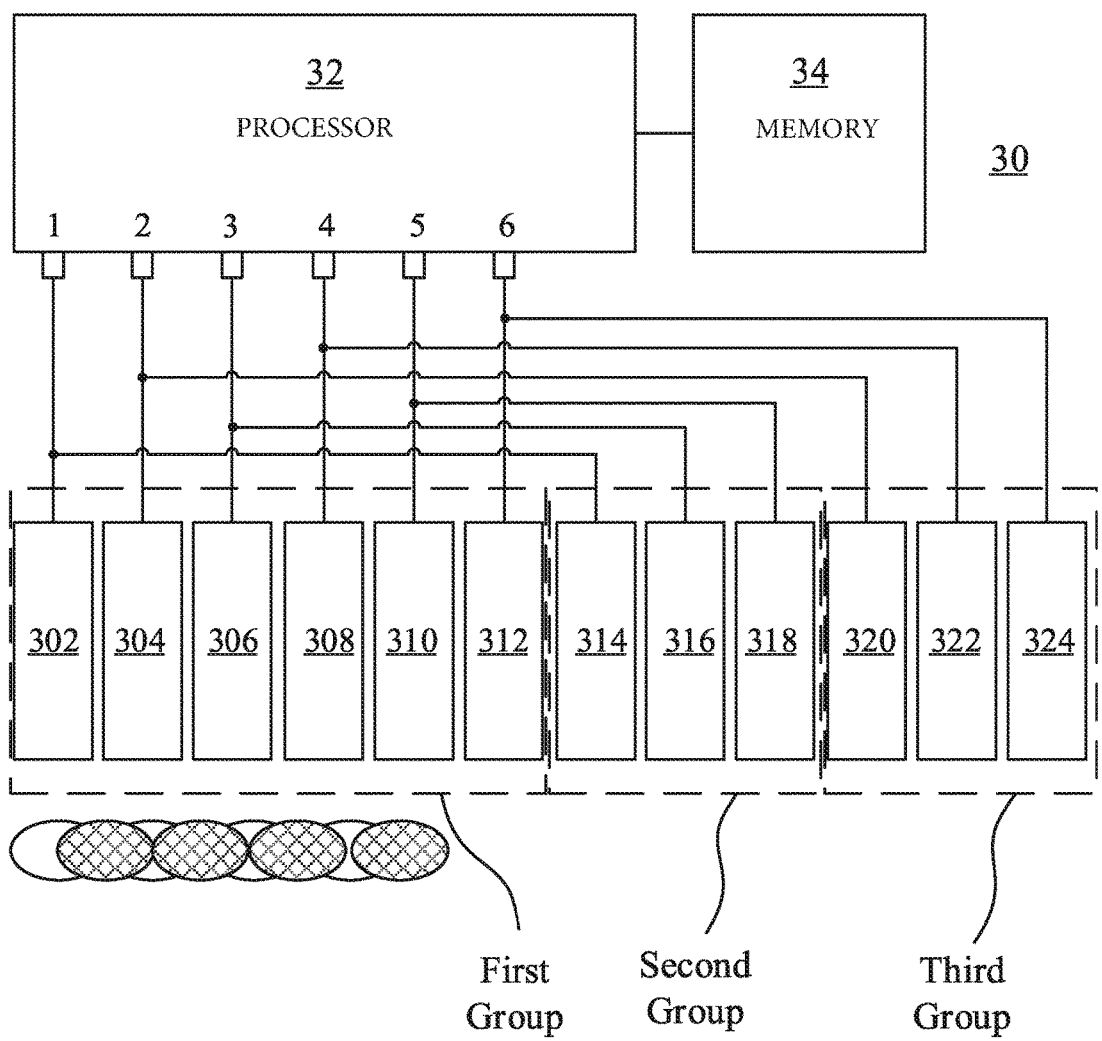
FIG. 3 is a schematic diagram of a touch sensor in accordance with an embodiment of the present invention.

Referring now to FIG. 3, a touch sensor 30 according to an exemplary embodiment of the present invention includes a plurality of electrodes 302 to 324 and a processor 32. The electrodes 302-324 are serially arranged. For example, in the embodiment shown, the electrodes 302-324 are arranged in a line. However, in other embodiment, the electrodes could be arranged in a circle, a semi-circle, an arc, an array, etc. The processor 32 includes multiple input terminals 1-6 for receiving trigger signals from the electrodes 302-324, as described in detail below. There are more electrodes than input terminals, so in order to enable a touch sensor in which the processor has fewer inputs than there are electrodes, each of the input terminals is coupled with one or more of the electrodes 302-324. In the current embodiment, the touch sensor 30 includes twelve electrodes 302-324 and the processor 32 includes six input terminals 1-6. The electrodes 302-324 provide sensed signals to the processor 32. The sensed signals change in response of a touch or movement of the electrodes 302-324.

The electrodes are grouped into a first group, a second group, and a third group. The first group includes the first six electrodes 302-312. The electrodes of the first group are serially arranged, and each electrode of the first group is coupled with a corresponding input terminal of the processor 32. That is, electrode 302 is coupled with input terminal 1, electrode 304 is coupled with input terminal 2, etc. The second group of electrodes includes the electrodes 314, 316, and 318, which are serially arranged at an end of the first group of electrodes, e.g. after the electrode 312. Each electrode of the second group is sequentially coupled with input terminals 1, 3 and 5 of the processor 32. That is, electrode 314 is coupled with input terminal 1, electrode 316 is coupled with input terminal 3, and electrode 318 is coupled with input terminal 5. Thus, the electrodes of the second group 314, 316 and 318 are coupled with odd numbered terminals 1, 3 and 5 of the processor. The third group of electrodes includes the electrodes 320, 322, and 324 that are serially arranged at an end of the second group of electrodes, e.g., after the electrode 318. Each electrode 320, 322 and 324 of the third group is sequentially coupled with the input terminals 2, 4 and 6 of the processor 32. That is, electrode 320 is coupled with input terminal 2, electrode 322 is coupled with input terminal 4, and electrode 324 is coupled with input terminal 6. It can be seen that the electrodes of the third group 320, 322, and 324 are coupled with even numbered inputs 2, 4, and 6 of the processor 32.

In the presently preferred embodiment, the electrodes 302-324 all have the same size and shape. In particular, each of the electrodes has the same width, and the width is such that when the touch sensor 30 is touched, two neighboring electrodes will be triggered simultaneously. An exception is for the first and last electrodes 302 and 324, which are on opposing ends, for these two electrodes, a touch may only be sensed by just that particular electrode, either 302 or 324 as the case may be. In other words, each of the electrodes is triggered simultaneous with one of its neighboring electrodes. For example, when the touch sensor 30 is touched and electrode 314 is triggered to give its sensed signal to the coupled input terminal 1 of the processor 32, one of its neighboring electrodes 312 or 316 is triggered at the same time. Responsively, sensed signals are sent to correspondingly coupled input terminals 6 or 3. For this purpose, the widths of the electrodes are sized to be within a predetermined range such that a touched area on the touch sensor will simultaneously cover two neighboring electrodes.

According to optional embodiments, for the end electrodes 302 and 324 that are located on either end of the touch sensor 32, these two electrodes can be triggered to provide sensed signals to corresponding input terminals 1 or 6 without its neighboring electrode 304 or 322 being triggered.

Touch positions on the touch sensor can be determined by the processor 32 using a lookup table, which may be located in a memory of the processor or in a storage device 34 coupled to the processor. The lookup table pairs information of the triggered position on the electrodes with a composition of the sensed signals from the electrodes. FIG. 4 shows an exemplary table 400 for the embodiment of the touch sensor 30 of FIG. 3. As previously described, an electrode is triggered together with one of its neighboring electrodes. For example, if electrodes 314 and 316 are touched, the correspondingly coupled input terminals 1 and 3 receive the sensed signals, represented as digit "1" in the composition of signals. That is, in the table 400, the right side two columns indicate which electrodes have been touched and then the corresponding row in the table 400 indicates which processor inputs receive a sensed signal. The processor 32 looks up the value, in this case "101000" in the table 400, and position "7" (from the "position" column). From the table 400, it can be seen that each of the input terminals coupling with two of the electrodes ensures the composition of values of the sensed signals to be unique in the table, which enables the determination of the touch position.

Although it can be seen from FIG. 3 that the storage device 34 is illustrated to be outside the processor 32. In alternative embodiments, the storage device 34 can be embedded in the processor 32. It will be understood by those of skill in the art that if the touch sensor includes twelve electrodes, thirteen positions can be determined by storing thirteen pairs of the position information and the sensed signal compositions. In other words, the table stores n+1 pairs of the position information and the sensed signal compositions, where n is the number of electrodes.

It will be understood that, if the touch sensor includes a different number of electrodes, e.g., fourteen electrodes, the processor is configured to include an odd number, e.g., seven, input terminals. The fourteen electrodes can include a first group of seven electrodes each coupled with a respective one of the input terminals, a second group of four electrodes each coupled with the input terminals to which odd numbered electrodes of the first group are coupled, and a third group of three electrodes each coupled with the input terminals to which even numbered electrodes of the first group are coupled. Preferably, the number of the electrodes in the first group is equal to the number of input terminals of the processor (i.e., the number of input terminals of the processor used for touch sensing, since it will be understood that the processor will have many other input terminals used for other purposes), and the sum of the number of the electrodes in the second group and the number of the electrodes in the third group equals the number of the electrodes in the first group.

Figure 5:
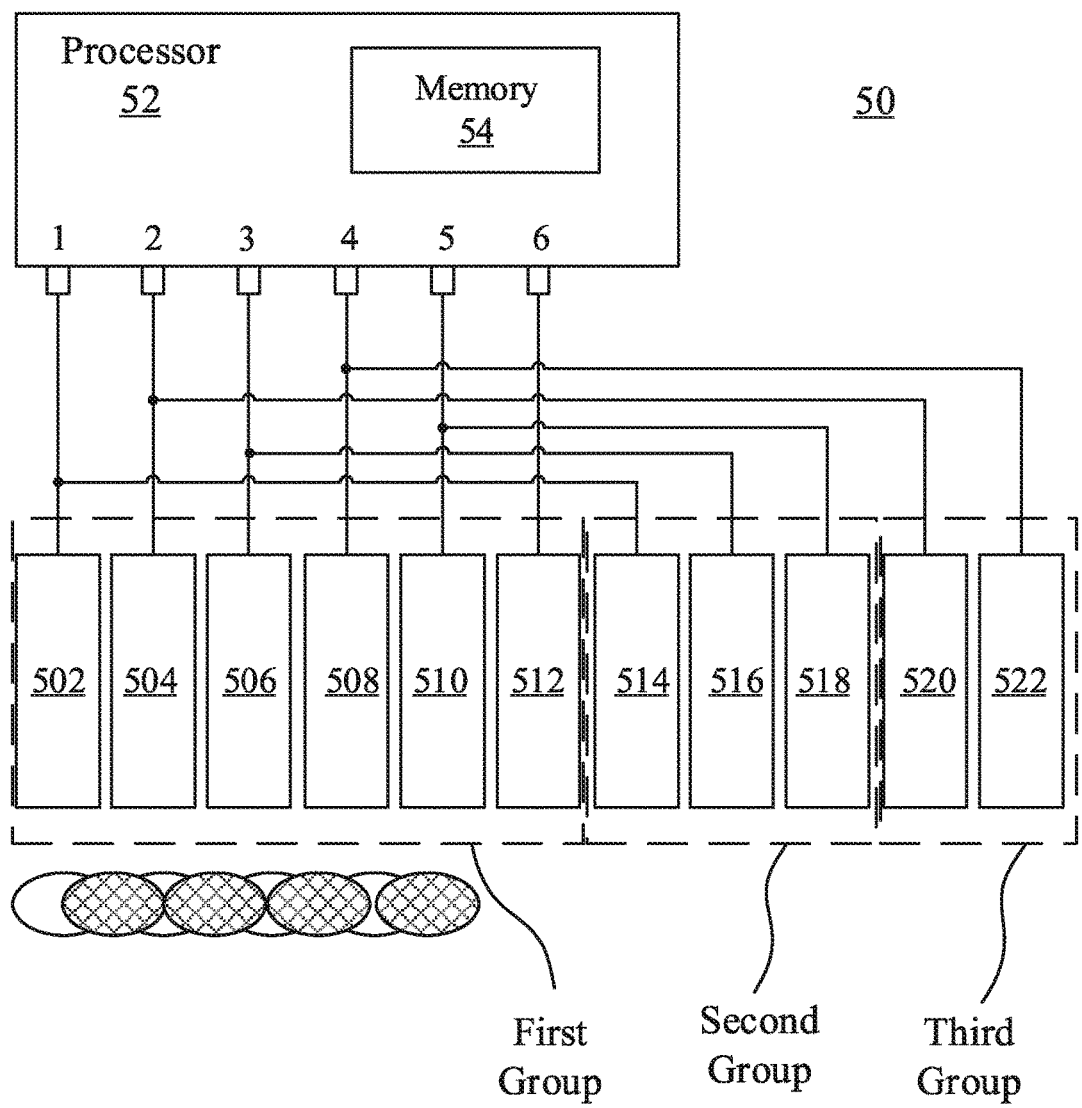
FIG. 5 is a schematic diagram of another touch sensor in accordance with an embodiment of the present invention.

FIG. 5 shows another exemplary embodiment of the touch sensor 50. The touch sensor 500 includes eleven electrodes 502-522, and a processor 52 that has six input terminals 1-6 for being coupled with the electrodes 502-522. The first group of six electrodes 502, 504, 506, 508, 510, and 512 are sequentially coupled with the six input terminals 1-6 of the processor 52. The second group of three electrodes 514, 516, and 518 are coupled with the input terminals 1, 3 and 5, which are the odd numbered electrodes. The third group of two electrodes 520 and 522 are coupled with the input terminals 2 and 4, which are the even numbered electrodes. The input terminal 6 is coupled with only one electrode 512. In alternative other embodiments, any one of the input terminals can be configured to be coupled with only one of the electrodes. It can be seen that if the touch sensor includes an odd number of electrodes, the processor will use at least (n+1)/2 input terminals for coupling with the electrodes, while if the touch sensor includes an even number of electrodes, the processor will use at least n/2 input terminals for connecting the electrodes, where n is the number of electrodes. With at least one of the input terminals being coupled with two of the electrodes, the number of the input terminals is less than the number of the electrodes. The size of the processor and/or the number of pins required to connect to the electrodes is reduced at least some of the input terminals are coupled to more than one electrode. In the current embodiment, a memory 54 that stores the lookup table is embedded in the processor 52.

It can be seen from FIG. 3 that neighboring electrodes are coupled with different input terminals. Preferably, for keeping the composition of signals unique in the table, like the table 400 of FIG. 4, the two electrodes coupled with one input terminal are not neighboring electrodes. However, in alternative embodiment, it is possible to couple neighboring electrodes with one input terminal while keeping the composition of signals unique in the table.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A touch sensor, comprising:
a processor having multiple input terminals; and
a plurality of electrodes arranged in series, wherein the plurality of electrodes comprises:
a first group of serially arranged electrodes, each of the first group of electrodes being coupled with a corresponding input terminal of the processor;
a second group of electrodes serially arranged at an end of the first group of electrodes, the second group of electrodes being sequentially coupled with the input terminals of the processor that are coupled to odd numbered electrodes of the first group; and
a third group of electrodes serially arranged at an end of the second group of electrodes opposite to the first group of electrodes, the third group of electrodes being sequentially coupled with the input terminals of the processor that are coupled to even numbered electrodes of the first group,
wherein the plurality of electrodes is arranged such that each of the electrodes other than the electrodes on the ends is triggered simultaneously with at least one corresponding neighboring electrode, and wherein when an electrode is triggered, the triggered electrode generates a corresponding sensed signal.

2. The touch sensor of claim 1, further comprising a memory that stores a table that pairs information of trigger positions of the plurality of electrodes with compositions of the sensed signals.

3. The touch sensor of claim 2, wherein the processor accesses the table in response to a received sensed signal, and determines the trigger position using the paired information.

4. The touch sensor of claim 2, wherein the table stores n+1 pairs of the position information and the sensed signal compositions, wherein n is the number of electrodes.

5. The touch sensor of claim 1, wherein each of the electrodes of the plurality of electrodes has a same width such that each of the electrodes other than the electrodes on the ends is triggered simultaneously with a corresponding neighboring electrode.

6. The touch sensor of claim 5, wherein the width of the electrodes is within a predetermined range, such that a touched area on the touch sensor simultaneously covers two of the neighboring electrodes.

7. The touch sensor of claim 1, wherein a sum of the number of the electrodes in the second group and the number of the electrodes in the third group equals the number of the electrodes in the first group.

8. A touch sensor, comprising:
   a first number of serially arranged electrodes configured to provide sensed signals when touched, wherein the serially arranged electrodes comprise a first group, a second group and a third group of electrodes that are arranged sequentially;
   a processor having a second number of input terminals for receiving the sensed signals, wherein the second number is less than the first number,
   wherein each of the input terminals is coupled with two of the electrodes for receiving the corresponding sensed signals therefrom,
   wherein the processor is operable to determine a touch position on the electrodes in response to simultaneously receiving two sensed signals from two neighboring electrodes, and wherein:
   each of the first group of electrodes is sequentially coupled with a corresponding input terminal of the processor;
   each of the second group of electrodes is coupled with the input terminals of the processor that odd numbered electrodes of the first group are coupled; and
   each of the third group of electrodes is coupled with the input terminals of the processor that even numbered electrodes of the first group of electrodes are coupled.

9. The touch sensor of claim 8, wherein the two electrodes coupled to one input terminal are not neighboring electrodes.

10. The touch sensor of claim 8, wherein the number of the input terminals coupled with the electrodes is:
    n/2 if n is an even number; and
    (n+1)/2 if n is an odd number,
    wherein n is the first number.

11. The touch sensor of claim 8, wherein:
    the number of electrodes in the first group is equal to the number of the input terminals of the processor; and
    a sum of the number of the electrodes in the second group and the number of the electrodes in the third group equals the number of the electrodes in the first group.

12. The touch sensor of claim 11, wherein:
    each electrode of the first group of electrodes is sequentially coupled with a corresponding input terminal of the processor; and
    each electrode of the second group of electrodes and each electrode of the third group of electrodes are alternately coupled with the input terminals of the processor.

13. The touch sensor of claim 12, wherein the processor is coupled to a memory in which a lookup table is stored, and wherein the lookup table stores information of paired sensed signals that allows the processor to determine a touch position using paired information from the table.

14. A method for determining a touch position on a touch sensor, wherein the touch sensor comprises multiple serially arranged electrodes, and wherein the electrodes comprise a first group, a second group and a third group of electrodes that are sequentially arranged, the method comprising:
    coupling the first group of electrodes for receiving sensed signals from the electrodes;
    sequentially coupling the electrodes of the second group to odd numbered electrodes of the first group;
    sequentially coupling the electrodes of the third group to even numbered electrodes of the first group; and
    determining a touch position on the electrodes using a sensed signal, wherein the multiple electrodes are arranged such that a touch contacts at least two adjacent electrodes of the multiple electrodes, thereby triggering each of the electrodes to generate the sensed signal.

15. The method of claim 14, the determining step further comprising:
    accessing a lookup table using the received signals, wherein the table pairs information of touch positions of the multiple electrodes with compositions of the sensed signals.

16. The method of claim 15, wherein the table stores n+1 pairs of the position information and the sensed signal compositions, wherein n is the number of electrodes.

17. The method of 14, wherein the electrodes are sized and shaped to have a same width such that each of the electrodes, other than the electrodes on the ends, is triggered simultaneously with a corresponding neighboring electrode.

18. The method of claim 17, wherein the width of the electrodes is within a predetermined range, such that a touched area on the touch sensor simultaneously covers two neighboring electrodes.

19. The method of claim 14, wherein a sum of the number of the electrodes in the second group and the number of the electrodes in the third group equals the number of the electrodes in the first group.

* * * * *